United States Patent
Tercariol et al.

(10) Patent No.: US 8,830,772 B2
(45) Date of Patent: Sep. 9, 2014

(54) SENSE AMPLIFIER CIRCUIT

(75) Inventors: Walter Luis Tercariol, Campinas (BR); Andre Luis Vilas Boas, Campinas (BR); Fernando Zampronho Neto, Jacarei (BR)

(73) Assignee: Freescale Semiconductor, Inc., Austin, TX (US)

( * ) Notice: Subject to any disclaimer, the term of this patent is extended or adjusted under 35 U.S.C. 154(b) by 272 days.

(21) Appl. No.: 13/524,555

(22) Filed: Jun. 15, 2012

(65) Prior Publication Data

US 2013/0336066 A1 Dec. 19, 2013

(51) Int. Cl.
*G11C 7/00* (2006.01)
(52) U.S. Cl.
USPC .......................................... 365/205; 365/202
(58) Field of Classification Search
USPC .................................................. 365/205, 202
See application file for complete search history.

(56) References Cited

U.S. PATENT DOCUMENTS

| | | | |
|---|---|---|---|
| 6,426,668 B1 | 7/2002 | Morrish et al. | |
| 7,233,539 B2 | 6/2007 | Boas et al. | |
| 7,590,003 B2 | 9/2009 | Jo et al. | |
| 7,983,087 B2 | 7/2011 | Wang | |
| 7,990,792 B2 | 8/2011 | Abe et al. | |
| 7,995,398 B2 | 8/2011 | Wang | |
| 2012/0099375 A1* | 4/2012 | Choi | 365/185.11 |

* cited by examiner

*Primary Examiner* — Vu Le

(57) ABSTRACT

A sense amplifier (100) includes first and second inverters (112 and 113). The first inverter has an input terminal (116) and an OUT_B output node and a first transistor (124). The second inverter (113) has an input terminal (115) and an OUT output node and a second transistor (125). The OUT_B output node of the first inverter is coupled to an input terminal of the second inverter, and the OUT node of the second inverter is coupled to an input terminal of the first inverter. The sense amplifier does not use a reference current; therefore, the sense amplifier does not need a reference current generator. The sense amplifier needs only one enable signal to reset a latch (110) of the sense amplifier. When coupled to a non-volatile memory element, voltages at the output nodes are indicative of a logic level of a bit stored in the non-volatile memory element.

20 Claims, 3 Drawing Sheets

SENSE AMPLIFIER CIRCUIT

BACKGROUND

1. Field

This invention relates generally to memory circuits, and more specifically to a sense amplifier for use with memory such as flash memory.

2. Related Art

Flash memory stores data in one or more non-volatile memory devices, each of which comprises a floating gate n-channel metal-oxide-semiconductor field-effect transistor (hereinafter "bitcell"). A bitcell stores one bit of information. The bitcell maintains data even if the bitcell is disconnected from a power supply.

Data storage is based on a threshold voltage of the bitcell, which depends on an electric charge present in a floating gate. If the floating gate has a lack of electrons, it becomes positively charged. Such positive charge of the floating gate attracts electrons to a surface of a bulk; therefore, a control gate needs less voltage to attract electrons to the surface of the bulk. Thus, the threshold voltage of the bitcell decreases. On the other hand, if the floating gate is negatively charged, it repels electrons from the bulk; therefore, fewer electrons are available at the surface of the bulk. In this situation, the control gate needs more voltage to attract electrons from the surface of the bulk. Thus, the threshold voltage of the bitcell increases.

A logic level of a bit stored in a bitcell can be determined by measuring a drain current of the bitcell that occurs as a result of a read voltage being applied to a gate of the bitcell during a read operation. A sense amplifier is a circuit that detects an amount of the drain current of the bitcell, and, based on the amount of the drain current, outputs a signal that is indicative of the logic level of the bit stored in the bitcell.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
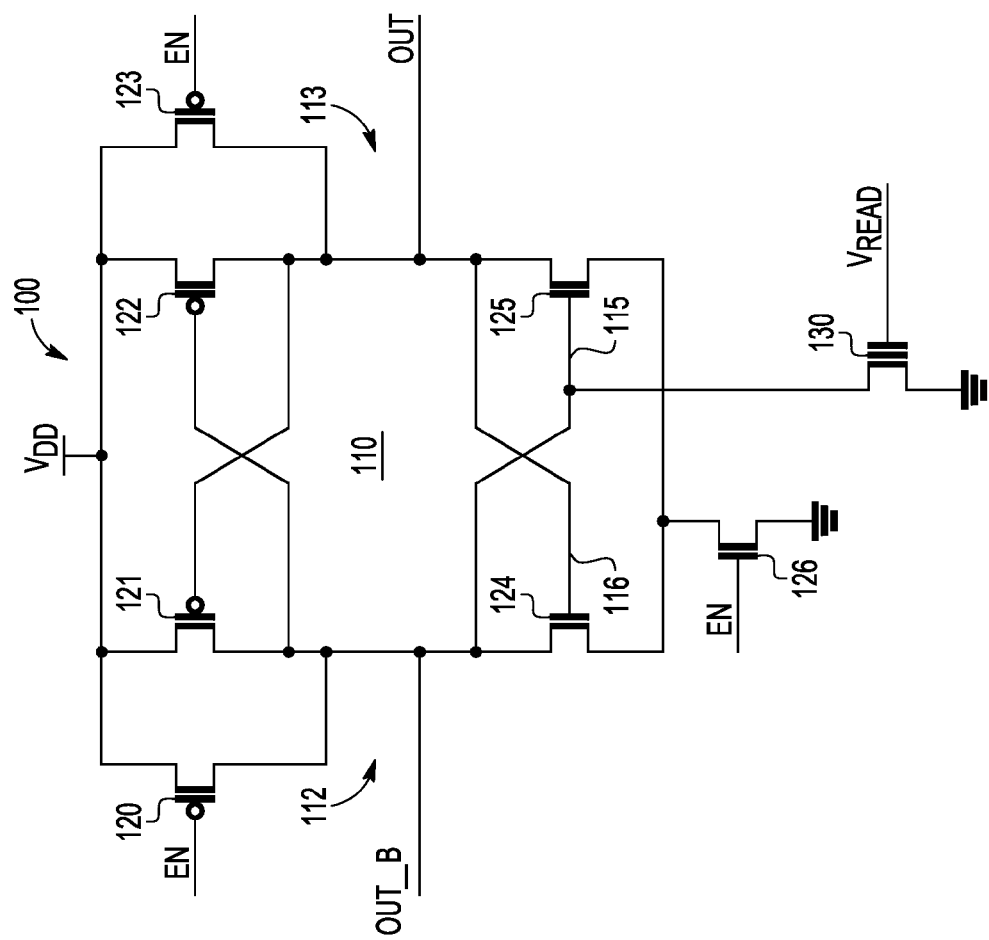
FIG. 1 illustrates a simplified schematic diagram of a sense amplifier in accordance with one embodiment of the invention, and a bitcell coupled thereto.

One known sense amplifier requires a reference current. If the bitcell current is smaller than the reference current, a logic level is determined. If the bitcell current is larger than the reference current, another logic level is determined. With the known sense amplifier there is a need to match a mirrored current of the known sense amplifier to the reference current. A precision of detection by the known sense amplifier of the bitcell current is affected by a precision of the matching between the mirrored current and the reference current. The known sense amplifier typically includes a trimming structure to match the mirrored current and the reference current.

The known sense amplifier becomes particularly disadvantageous when it is used with a large data bus. Each sense amplifier reads one bitcell of the bus data. If a data bus is large, an equally large number of sense amplifiers are needed, i.e., one amplifier for each bit of the data bus. When only a single reference current generator is used with a plurality of sense amplifiers, it may be difficult to match the mirrored current of each sense amplifier to the reference current of the single reference current generator. In a system having a large (e.g., 32-bit or greater) data bus, it may be difficult to determine whether the mirrored current of each sense amplifier is matched to the reference current because the matching depends on where each sense amplifier is disposed in a layout. On an integrated circuit, there is distance between the reference current generator and the sense amplifiers. Any mismatch between the reference current generator and the current mirror of a sense amplifier increases as the distance increases. For example, with a 148-bit data bus, the matching of one reference current generator with 148 current mirrors is difficult for geometric reasons. Although the matching may be adequate when a data bus is small, the matching may be inadequate when the data bus is large (i.e., many lines). In the example of a 148-bit data bus, the current mirrors of the nearest four or five sense amplifiers to the reference current generator may be matched well, but the current mirrors of the other 144 or 143 sense amplifiers may not be matched well due to their greater distance from the reference current generator.

Providing a separate reference current generator for each sense amplifier allows better matching of the current mirror of the known sense amplifier to the reference current. However, providing a separate reference current generator for each sense amplifier is disadvantageous because it increases power consumption of read circuitry of a flash memory system.

The known sense amplifier requires three signals, i.e., PRE-CHARGE, ISOLATION and LATCH, for controlling the latch, and additional circuitry is needed to generate such signals. The additional circuitry disadvantageously occupies additional silicon area.

The known sense amplifier includes a latch connected to OUT and OUT_B nodes of the known sense amplifier. The known sense amplifier may have a problem related to transistors of the latch. Such transistors need to be matched, mainly with regard to metal lines connected to them. If a length of the metal lines that connect such transistors to the OUT node is greater than a length of the metal lines that connect such transistors to the OUT_B node, the parasitic capacitances at each of these nodes is different. Therefore, a slope of a voltage at these nodes during an isolation phase is different from a slope of a voltage at these nodes during pre-charge and latch phases, thereby causing an error in determining the logic level of the bit stored in the bitcell.

FIG. 1 illustrates a simplified functional block diagram of one embodiment of a sense amplifier 100 in accordance with the invention. The sense amplifier 100 in accordance with the invention overcomes limitations of the known sense amplifier.

The sense amplifier 100 advantageously eliminates any need to match a mirrored current to a reference current. This is because the sense amplifier 100 does not include a current mirror and does not use a reference current. Therefore, the sense amplifier 100 does not need a reference current generator. Consequently, power consumption is greatly reduced.

The sense amplifier 100 advantageously needs only one control signal, an enable (EN) signal. The use of only a single control signal simplifies circuitry (not shown) responsible for generating the control signal for the sense amplifier 100. Use by the sense amplifier 100 of the EN signal is more efficient than use by the known sense amplifier of the PRE-CHARGE signal. The sense amplifier 100 uses simpler read logic because it needs only one control signal. Because the sense amplifier 100 in accordance with the invention needs fewer control signals, fewer trimmings are needed, which reduces test time, thereby reducing cost.

The sense amplifier 100 occupies about half the silicon area occupied by the known sense amplifier. For a large number of sense amplifiers, considerable silicon area can be saved.

In one embodiment, the sense amplifier 100 is a portion of a flash memory block (not shown) of a microcontroller. Other portions of the flash memory block may include: a flash memory array, regulators (charge pump and linear), internal logic control (internal address decoder, etc.) and bandgap. The sense amplifier 100 includes a latch 110. The latch 110 includes an inverter 112 that has an OUT_B node and an inverter 113 that has an OUT node. Inverter 113 has an input terminal 115 connected to the OUT_B node of inverter 112. Inverter 112 has an input terminal 116 connected to the OUT node of inverter 113. An output of the sense amplifier 100 includes at least one of a voltage at the OUT node and a voltage at the OUT_B node.

In one embodiment, latch 110 comprises PMOS transistors 121 and 122, and NMOS transistors 124 and 125, configured as illustrated in FIG. 1. Advantageously, NMOS transistors 124 and 125 are purposefully mismatched in a certain, selected manner, as described hereinbelow. By "mismatched" it is meant that NMOS transistor 125 is stronger than NMOS transistor 124. Inverter 113 includes PMOS transistor 122 and NMOS transistor 125. PMOS transistor 122 has a source terminal coupled to a first terminal ($V_{DD}$) of a power supply, a drain terminal coupled to the OUT node, and a gate terminal coupled to the OUT_B node. NMOS transistor 125 has a drain terminal coupled to the OUT node, a source terminal coupled to a drain terminal of an NMOS transistor 126, and a gate terminal coupled to the OUT_B node. Inverter 112 includes PMOS transistor 121 and NMOS transistor 124. PMOS transistor 121 has a source terminal coupled to the first terminal ($V_{DD}$) of the power supply, a drain terminal coupled to the OUT_B node, and a gate terminal coupled to the OUT node. NMOS transistor 124 has a drain terminal coupled to the OUT_B node, a source terminal coupled to the drain terminal of NMOS transistor 126, and a gate terminal coupled to the OUT node. The NMOS transistor 126 has a source terminal coupled to a second terminal ($V_{SS}$ or ground) of the power supply and a gate terminal to the EN signal.

In one embodiment of the sense amplifier 100, the latch 110 is coupled to PMOS transistor 120 and PMOS transistor 123, configured as illustrated in FIG. 1. A source terminal of PMOS transistor 120 is coupled to the first terminal ($V_{DD}$) of the power supply, a drain terminal of PMOS transistor 120 is coupled to the OUT_B node, and a gate terminal of PMOS transistor 120 is coupled to the EN signal. A source terminal of PMOS transistor 123 is coupled to the first terminal ($V_{DD}$) of the power supply, a drain terminal of PMOS transistor 123 is coupled to the OUT node, and a gate terminal of PMOS transistor 123 is coupled to the EN signal.

A memory element may be coupled to the sense amplifier 100. In one embodiment, a bitcell 130 of a non-volatile, electrically erasable programmable read-only memory (EEPROM) or flash memory array may be coupled to the input 115 of inverter 113 of the latch 110 of the sense amplifier 100. The flash memory array includes columns and rows of bitcells. There is a single sense amplifier 100 associated with each column of bitcells of the flash memory array. Through a selection means, the single sense amplifier 100 determines, at any given time, the logic level of a bit stored in one bitcell among a plurality of bitcells in the column associated with the single sense amplifier.

When the bitcell 130 is coupled to the sense amplifier 100, a drain terminal of the bitcell is coupled to the drain terminal of NMOS transistor 124 and to a gate terminal of NMOS transistor 125. A source terminal of the bitcell 130 is coupled to the second terminal ($V_{SS}$ or ground) of the power supply. A gate terminal of the bitcell 130 is coupled to a digital control block (not shown) of a flash management unit of a microcontroller. The digital control block selectively couples the gate terminal of the bitcell 130 to a program voltage when the bitcell is being programmed, to an erase voltage when the bitcell is being erased, and to a read voltage ($V_{READ}$) when the bitcell is being read. The sense amplifier 100 detects a logic level of the bit stored in the bitcell 130 by measuring a drain current of the bitcell that occurs when $V_{READ}$ is applied to a gate of the bitcell during a read operation. Based on an amount of the drain current, the sense amplifier 100 outputs one or more signals that indicate the logic level of the bit stored in the bitcell 130. For the sense amplifier 100, the one or more signals are the voltage at the OUT node and the voltage at the OUT_B node. In the description of the sense amplifier 100 hereinbelow, it is assumed that the gate terminal of the bitcell 130 is coupled to $V_{READ}$ at all times. In one embodiment, $V_{READ}$ is 4.2V.

In the description of the sense amplifier 100 hereinbelow, it is assumed that an increase in threshold voltage ($V_T$) of the bitcell 130, such that $V_T > V_{READ}$, corresponds to a programmed bitcell, and that a decrease in $V_T$ of the bitcell, such that $V_T < V_{READ}$, corresponds to an erased bitcell. By "programmed" it is meant that a logical "1" is stored in the bitcell 130. By "erased" it is meant that a logical "0" is stored in the bitcell 130.

In the description of the sense amplifier 100 hereinbelow, it is assumed that the digital control block has programmed or has erased the bitcell 130 prior to the sense amplifier 100 reading the logic level of the bit stored in the bitcell.

The sense amplifier 100 has a detection threshold for sensing current. The latch 110 of the sense amplifier 100 goes to a first output logic state if a drain current of the bitcell 130 (hereinafter "bitcell current") is smaller than the detection threshold of the sense amplifier 100. The latch 110 goes to a second output logic state if the bitcell current is larger than the detection threshold of the sense amplifier 100.

In the embodiment illustrated in FIG. 1, if the bitcell current is greater than the detection threshold of the sense amplifier 100, the bitcell 130 is in an erased state; if the bitcell current is less than the detection threshold of the sense amplifier, the bitcell is in a programmed state. In another embodiment (not shown) if the bitcell current is greater than the detection threshold of the sense amplifier 100, the bitcell 130 is in a programmed state; otherwise, it is in an erased state.

When $V_T$ of the bitcell 130 has been increased to a voltage greater than $V_{READ}$ (because the bitcell is programmed), applying $V_{READ}$ to the gate of the bitcell 130 results in a small bitcell current. In one embodiment wherein $V_{READ}$ is 4.2V, $V_T$ of the bitcell 130 has been increased to 5V, thereby programming the bitcell. In the same one embodiment, the small bitcell current is about 1 µA. The amount of bitcell current is not large enough to alter the gate voltage of NMOS transistor 125. Therefore, the small amount of bitcell current does not change the state of the output state of the latch 110. When $V_T$ of the bitcell 130 has been decreased to a voltage less than $V_T$ (because the bitcell is erased), applying $V_{READ}$ to the gate of the bitcell 130 results in a large bitcell current. In the one embodiment wherein $V_{READ}$ is 4.2V, $V_T$ of the bitcell 130 has been decreased to 3V, thereby erasing the bitcell. In the same one embodiment, the large bitcell current is 40 µA. The amount of bitcell current is large enough to alter the gate voltage of NMOS transistor 125. Therefore, the large amount of bitcell current changes the state of the output state of the latch 110.

NMOS transistor 124 has a channel width (W) to channel length (L) ratio that is slightly less than the W/L of NMOS transistor 125. In one embodiment, the W/L of NMOS transistor 124 is 2.0 and the W/L of NMOS transistor 125 is 2.2. In one embodiment, NMOS transistors 124 and 125 have a same channel width, but different channel length. The W/L of NMOS transistor 124 is slightly less than the W/L of NMOS transistor 125 so that the OUT node always assumes a consistent logic level and so that the OUT_B node always assumes a consistent different logic level, if the sense amplifier 100 is not coupled to the bitcell 130 (or if the sense amplifier 100 is coupled to the bitcell but the bitcell current is less than the detection threshold of the sense amplifier).

Figure 2:
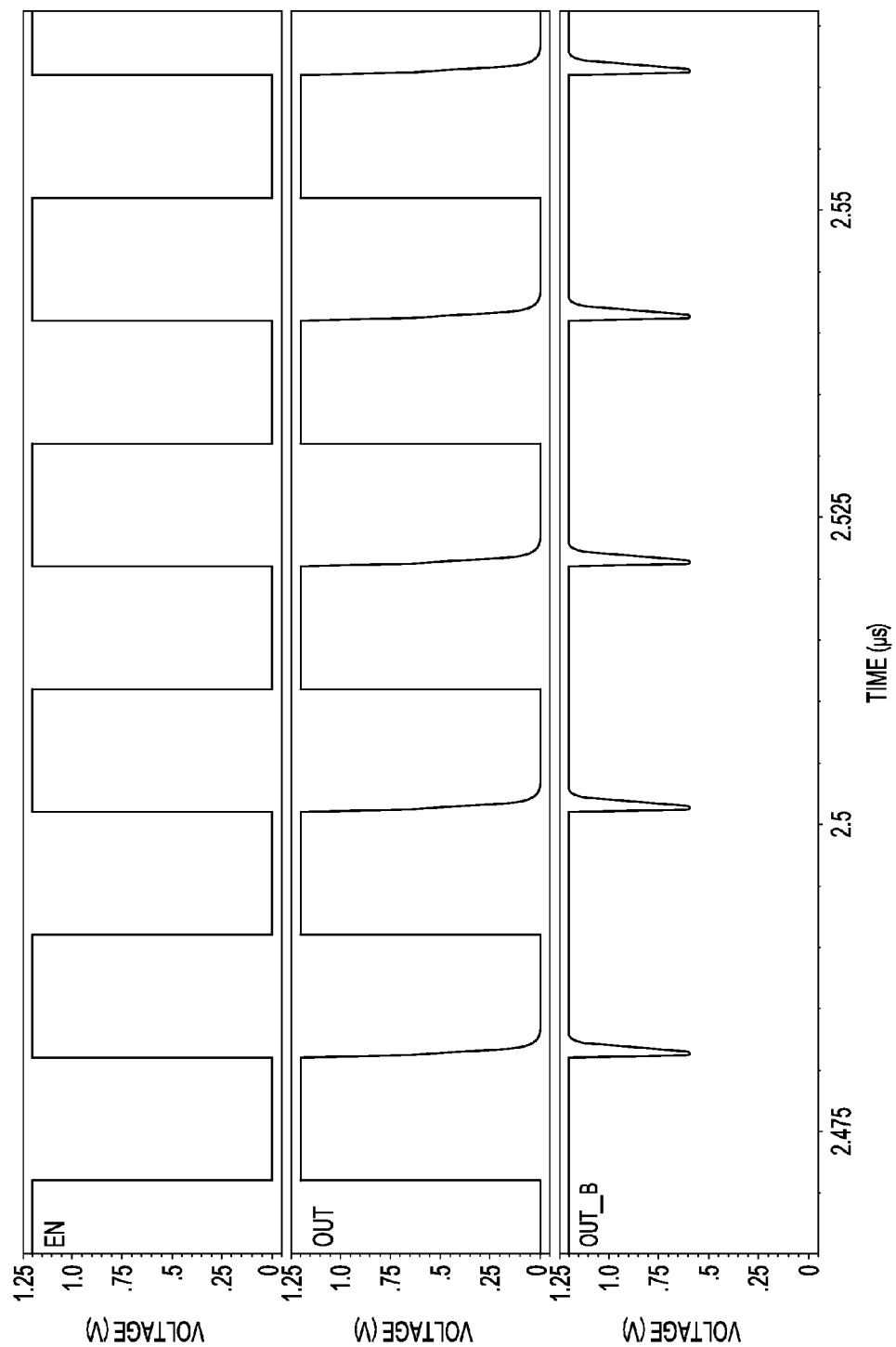
FIG. 2 illustrates a set of waveforms present in the sense amplifier of FIG. 1 when the bitcell is programmed.
Figure 3:
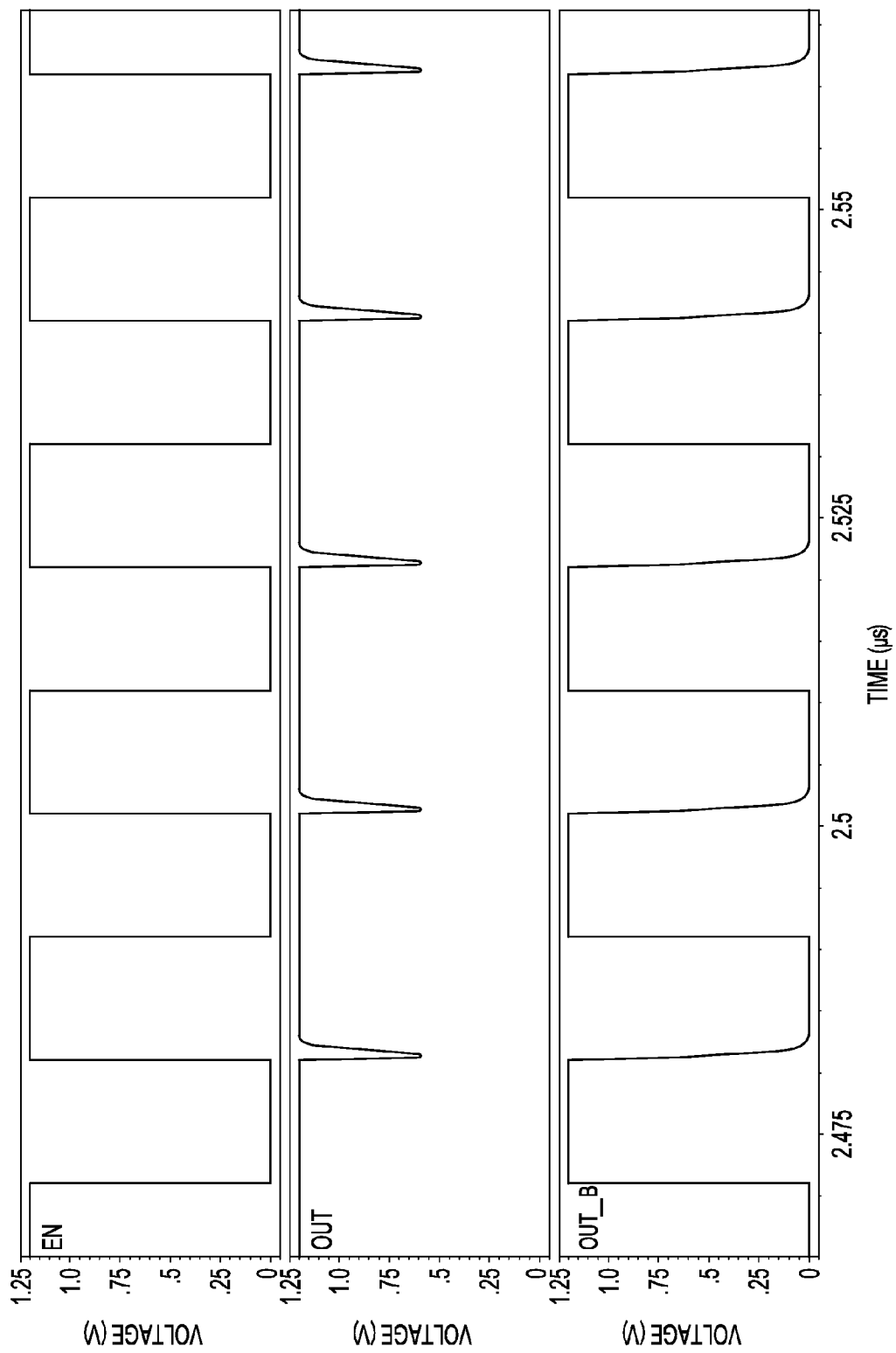
FIG. 3 illustrates a set of waveforms present in the sense amplifier of FIG. 1 when the bitcell is erased.

The sense amplifier 100 receives the EN signal from a read logic (not shown) of the digital control block of the flash management unit. The EN signal, when low (EN=0), causes PMOS transistors 120 and 123 to reset the latch 110 at each read operation. In one embodiment, a frequency of the EN signal is 50 MHz. The EN signal is shown in FIGS. 2 and 3. Assume that the EN signal is initially low (EN=0). The EN signal is low prior to a read operation. When the EN signal is low, PMOS transistor 120 and PMOS transistor 123 conduct, and the OUT node and the OUT_B node both go to approximately $V_{DD}$ (hereinafter "$V_{DD}$"). In one embodiment, $V_{DD}$ is 1.2V. PMOS transistor 120 and PMOS transistor 123 put the OUT node and the OUT_B node in a same state when EN=0. The OUT node and the OUT_B node are forced to $V_{DD}$ by PMOS transistors 120 and 123 which create a low impedance path to $V_{DD}$ when they are conducting, and which also means that, when EN=0, $V_{GATE}$ and $V_{DRAIN}$ of NMOS transistors 124 and 125 are at $V_{DD}$. Note that, at this juncture, $V_{SOURCE}$ of NMOS transistors 124 and 125 is at high impedance because NMOS transistor 126 is cut-off. The on/off state of transistors 121, 122, 124 and 125 are interdependent on each other due to positive feedback; however, the states of the OUT node and the OUT_B node do not change while EN=0. This is because the latch is effectively disabled when EN=0 because NMOS transistor 126 is cut-off when EN=0. As a result of NMOS transistors 126 being cut-off, there is no current through NMOS transistor 124 or NMOS transistor 125 when EN=0. As long as EN=0, the OUT and OUT_B nodes remain at $V_{DD}$ regardless of the amount of bitcell current. In other words, when EN=0, the OUT and OUT_B nodes remain at $V_{DD}$ regardless of whether the bitcell 130 is programmed or erased.

A high EN signal (EN=1) means that a read operation is being performed. When the EN signal goes high (EN=1), PMOS transistors 120 and 123 stop conducting and release the OUT and OUT_B nodes, respectively, from their pre-read (EN=0) states of both the OUT and OUT_B nodes being at $V_{DD}$.

Consider the read operation (EN=1) when the bitcell 130 is programmed. When the bitcell 130 is programmed, the bitcell current is of such small magnitude that its effect on the state of the latch 110 can be ignored. When EN=1, and when the bitcell current is ignored (or when there is no bitcell current), the tendency of the latch 110 is for the voltage of the OUT node to go down to approximately ground potential or $V_{SS}$ (hereinafter "ground") after the latch settles, in spite of the OUT node initially being at $V_{DD}$. This happens because NMOS transistors 124 and 125 are not matched. Because the OUT and OUT_B nodes are initially high, $V_{GS}$ of NMOS transistors 124 and 125 is at $V_{DD}$, which means that $V_{GS}$ of NMOS transistors 124 and 125 is at a high enough voltage such that NMOS transistors 124 and 125 initially conduct. However, the voltage of the OUT node decreases faster than the voltage of the OUT_B node because NMOS transistor 125 is stronger than NMOS transistor 124. Because $V_{GATE}$ of PMOS transistors 121 and 122 is $V_{DD}$, PMOS transistors 121 and 122 are initially not conducting. The faster decrease in the voltage of the OUT node causes PMOS transistor 121 to begin conducting before PMOS transistor 122 begins conducting. The PMOS transistor 121 conducting causes the OUT_B node to remain at $V_{DD}$. The OUT node going low causes NMOS transistor 124 to stop conducting (because the gate of NMOS transistor 124 is connected to the OUT node), thereby further assuring that the OUT_B node stays at $V_{DD}$. The high EN signal also causes PMOS transistors 120 and 123 to become cut-off (PMOS transistors 121 and 122 are already cut-off because the OUT and OUT_B nodes are high). Therefore, during a read operation (i.e., EN=1), when the bitcell 130 is programmed (i.e., bitcell current is very small), the OUT node is at ground and the OUT_B node is at $V_{DD}$, as illustrated in FIG. 2.

Now consider the read operation (EN=1) when the bitcell 130 is erased. When the bitcell 130 is erased, the bitcell current is of such large magnitude that its effect on the state of the latch 110 must be considered. When the EN signal goes high, both the OUT node and the OUT_B node start to decrease in voltage. However, the sense amplifier 100 is configured such that a sum of the current through NMOS transistor 124 and the bitcell current is greater than the current through NMOS transistor 125, if the bitcell is erased. Therefore, the OUT_B node goes to ground before the OUT node goes to ground, when the bitcell current is greater than the detection threshold current defined by Equation (1) hereinbelow. As a result, the latch 110 changes state. In effect, the bitcell "helps" NMOS transistor 124 act as if NMOS transistor 124 were stronger than NMOS transistor 125. An explanation for this behavior is as follows. PMOS transistors 120, 121, 122 and 123 each have an equivalent capacitance. PMOS transistors 120 and 121 can be treated as if they have a charge stored in them that is related to the voltage at the OUT_B node. PMOS transistors 122 and 123 can be treated as if they have a charge stored in them that is related to the voltage at the OUT node. At the moment that the EN signal goes high, $V_{DD}$ is the voltage stored in both the OUT_B node and the OUT node. The equivalent capacitances of PMOS transistors 120 and 121 are discharged by a current equal to the current through NMOS transistor 124 plus the bitcell current. The equivalent capacitances of PMOS transistors 122 and 123 are being discharged by another current equal to the current through NMOS transistors 125. The sense amplifier 100 is designed such that the current discharging the OUT_B node is greater than the other current discharging the OUT node, when the bitcell is erased. The first of: the combined equivalent capacitances of PMOS transistors 120 and 121, and the combined equivalent capacitances of PMOS transistors 122 and 123 that is discharged causes one of: the OUT_B node and the OUT node, respectively, to go to ground, depending on the state of the bitcell 130 (the other node remains at $V_{DD}$). When the first of the OUT_B node and the OUT node goes to ground, the other node is forced to $V_{DD}$ by the positive feedback of the latch 110. When the bitcell 130 is erased (and the bitcell current is large), it is the OUT_B node that first goes to ground during the read operation (if the bitcell current is greater than the detection threshold current), and, as a result, it is the OUT node that is forced to $V_{DD}$. Therefore, during a read operation (i.e., EN=1), when the bitcell 130 is erased (i.e., bitcell current is large), the OUT node is at $V_{DD}$ and the OUT_B node is at ground, as illustrated in FIG. 3.

The OUT node and the OUT_B node have a complementary behavior. When the OUT node is at $V_{DD}$, PMOS transistor 121 becomes cut-off or open, which causes the OUT_B node to be a high impedance node. Then, if there is a large bitcell current, the OUT_B node goes down to ground. The positive feedback of the latch 110 puts the OUT node to $V_{DD}$. On the other hand, if there is no bitcell current, the OUT_B node is at $V_{DD}$ and the OUT node is at ground.

If $V_T$ of the bitcell 130 is larger than the voltage $V_{READ}$ applied to a gate of the bitcell, very little current (e.g., 1 µA) flows through the drain of the bitcell, which indicates that the bitcell 130 is programmed. Under these conditions, the bitcell current is smaller than a detection threshold of the sense amplifier 100. In one embodiment, the detection threshold of the sense amplifier 100 is about 8 µA. Under these conditions, the voltage of the OUT node always goes to ground before the voltage of the OUT_B node goes to ground. This is because the transconductance ($g_m$) of NMOS transistor 125 is greater than the transconductance of NMOS transistor 124. In the same one embodiment, the transconductance of NMOS transistor 125 is 282 µA/V, and the transconductance of NMOS transistor 124 is 207 µA/V.

On the other hand, if $V_T$ of the bitcell 130 is smaller than the voltage $V_{READ}$ applied to a gate of the bitcell, a current (e.g., 40 µA) flows through the drain of the bitcell, which indicates that the bitcell 130 is erased. Under these conditions, the bitcell current is larger than a detection threshold of the sense amplifier 100. Under these conditions, the current through the drain of the bitcell 130 "helps" NMOS transistor 124 to pull the voltage of the OUT_B node to ground prior to the OUT node.

With one embodiment of the sense amplifier 100 that has a detection threshold of $I_{DETECTION}$=8 µA, the states of the OUT and OUT_B nodes may occur as follows:

When the bitcell current is less than 8 µA, such as when the bitcell is programmed and the bitcell current is typically 1 µA, or such as when the bitcell is disconnected from the sense amplifier and the bitcell current is effectively zero: OUT_B node=$V_{DD}$, and OUT node=ground.

When the bitcell current is greater than 8 µA, such as when the bitcell is erased and the bitcell current is typically 40 µA: OUT_B node=ground, and OUT node=$V_{DD}$.

A purpose of NMOS transistor 126 is to block any current that may otherwise flow through the latch 110 to ground during a non-read operation, such as an erase, a program, or a low-power operation. NMOS transistor 126 is used to avoid excessive power consumption by the sense amplifier 100 caused by excessive current through NMOS transistors 124 and 125 when the OUT and OUT_B nodes are at $V_{DD}$. When the OUT and OUT_B nodes are at $V_{DD}$, the EN signal is low which causes NMOS transistor 126 to be cut-off, thereby reducing the current through NMOS transistors 124 and 125. Although NMOS transistor 126 conducts during a read operation (because the EN signal is high), a drain current flows through NMOS transistor 126 only during a short time that the latch 100 is defining the states of the OUT and OUT_B nodes. After the states of the OUT and OUT_B nodes are defined, no significant current flows through NMOS transistor 126 in spite of the EN signal being high. This is because, when the states of the OUT and OUT_B nodes are defined, either: PMOS transistor 121 and NMOS transistor 125 are cut-off, or PMOS transistor 122 and NMOS transistor 124 are cut-off.

A value of the detection threshold of the sense amplifier 100 is dependent on the electrical parameters of the transistors of the sense amplifier. The detection threshold of the sense amplifier 100 depends on the W and the L of NMOS transistors 124 and 125, a mobility ($\mu_N$) of the electrons of these transistors, an oxide capacitance ($C_{OX}$) of these transistors, a threshold voltage $V_{T124,125}$ of NMOS transistors 124 and 125 (NMOS transistors 124 and 125 have a same threshold voltage), and a value of $V_{DD}$ of the sense amplifier 100. In one embodiment, the following equation shows a simplified description of the dependency of $I_{DETECTION}$ on the aforesaid parameters:

$$I_{DETECTION} = \frac{(V_{DD} - V_{T124,125})^2}{2} \mu_N C_{OX} W \left( \frac{L_{124} - L_{125}}{L_{124} L_{125}} \right) \quad \text{Equation (1)}$$

where $L_{124}$ and $L_{125}$ are the channel lengths of NMOS transistors 124 and 125, respectively, assuming that their channel widths are equal. When the bitcell current is greater than $I_{DETECTION}$, the output of the sense amplifier 100 changes. In one embodiment, when the bitcell current is greater than $I_{DETECTION}$, the bitcell 130 is determined, by the sense amplifier 100, to be erased, and when the bitcell current is less than $I_{DETECTION}$, the bitcell is determined, by the sense amplifier, to be programmed. From Equation (1), it can be seen that $I_{DETECTION}$, and, therefore, the detection threshold of the sense amplifier 100 is dependent on process, voltage and temperature.

In another embodiment, if the channel lengths of NMOS transistors 124 and 125 are equal and the channel widths of NMOS transistors 124 and 125 are different, the following equation applies:

$$I_{DETECTION} = \frac{(V_{DD} - V_{T124,125})^2}{2} \mu_N C_{OX} (W_{125} - W_{124}) \quad \text{Equation (2)}$$

In yet another embodiment, if the channel widths and the channel lengths of NMOS transistors 124 and 125 are different, the following equation applies:

$$I_{DETECTION} = \quad \text{Equation (3)}$$
$$\frac{(V_{DD} - V_{T124,125})^2}{2} \mu_N C_{OX} \left( \frac{W_{125} L_{124} - W_{124} L_{125}}{L_{124} L_{125}} \right)$$

In one embodiment, the bitcell current is about 1 µA when programmed, and this current increases due to an aging effect. In the same one embodiment, the bitcell current is about 40 µA when erased, and this current decreases due to the aging effect. The aging effect of the bitcell 130 is apparent after the bitcell is exercised about 100,000 times. Therefore, in one embodiment, the sense amplifier 100 is configured such that, when new, the bitcell current is different by a factor of about ten (10) between when the bitcell 130 is programmed versus when the bitcell is erased.

A margin of the threshold voltage $V_T$ of the bitcell 130 is defined as a maximum $V_T$ that produces a bitcell current equal to or greater than the detection threshold of the sense amplifier 100. The margin of $V_T$ of the bitcell 130 is smaller than $V_{READ}$. The margin of $V_T$ of the bitcell 130 can be determined by simulation. Advantageously, for the sense amplifier 100, there is not any need to do a layout parasitic extraction (LPE)

to discover mismatch between current mirrors because the sense amplifier does not have any current mirrors.

FIG. 2 illustrates a set of waveforms present in the sense amplifier of FIG. 1 when the bitcell 130 is programmed. FIG. 2 shows that when the EN signal is high, the OUT node goes to ground and the OUT_B node goes to $V_{DD}$ (after a glitch), when the bitcell 130 is programmed.

FIG. 3 illustrates a set of waveforms present in the sense amplifier of FIG. 1 when the bitcell 130 is erased. FIG. 3 shows that when the EN signal is high, the OUT node stays at $V_{DD}$ (after a glitch), and the OUT_B node goes to 0V, when the bitcell 130 is erased.

The OUT and OUT_B signals are latched in order to remove the glitches shown in FIGS. 2 and 3. For example, such glitches appear in FIG. 2 in that the voltage of the OUT_B node momentarily goes to about 0.6V (rather than 1.2V) when the EN signal goes high. The glitches are removed by other circuitry (not shown) connected to the OUT_B node of the sense amplifier 100.

In general, only one of the OUT node and the OUT_B node is needed as the output of the sense amplifier 100. However, in one embodiment, the output of the sense amplifier 100 comprises the OUT node and the OUT_B node because the output of the sense amplifier is coupled to other circuitry (not shown) that utilizes differential signaling. After being buffered, the output of the sense amplifier 100 is fed into a data out bus (not shown).

From a simulation, it has been determined that the detection threshold of the sense amplifier 100 is slightly more variable than the detection threshold of the known sense amplifier. Considering variation in temperature, process and mismatch, the minimum detection threshold for the sense amplifier 100 is 1.1 µA less than the known sense amplifier, while the maximum detection threshold for the sense amplifier 100 is 0.9 µA greater than the known sense amplifier. However, the mismatch model used in the simulation of the prior art sense amplifier considered a simple current mirror, and it is known that the mismatch increases when there are a large number of known sense amplifiers. Therefore, it is difficult to obtain a correct value of variation in matching of the known sense amplifiers by conducting only this type of simulation. A layout parasitic extraction (LPE) may also be needed to quantify more precisely the variation in matching of a large number of known sense amplifiers. On the other hand, with the sense amplifier 100, it is easier to determine a maximum variation in the detection threshold of the known sense amplifier because there is no need to perform a LPE. Therefore, the variation in detection threshold of the sense amplifier 100 found by simulation is close to reality. Consequently, the difference between the variation in the detection threshold of the sense amplifier 100 in accordance with the invention and the variation in the detection threshold of the known sense amplifier is smaller in reality than in the simulation.

The sense amplifier 100 has a good precision, but dependence between the bitcell and sense amplifier may be relatively large. As a result, the detection threshold may vary by a relatively large amount. In one embodiment, such dependence can be countered by performing three (3) or more read operations on a same bitcell 130, and using whichever outcome that occurs a majority of the times as a final result of the read operation.

When fabricated with 55 nm technology and with $V_{DD}$=1.2V, a single known sense amplifier, which includes one current mirror, consumes about 107.5 µA. The current mirror of the known sense amplifier consumes about 7.5 µA and a reference current generator consumes about 100 µA. On the other hand, the sense amplifier 100 in accordance with the invention, which does not include a current mirror and which does not require a reference current generator, consumes much less current than the known sense amplifier. When fabricated with 55 nm technology and with $V_{DD}$=1.2V, and when the sense amplifier 100 in accordance with the invention is performing a read operation (EN=1), the sense amplifier 100 consumes only about 50 nA typically and only about 100 nA in a worst case. When fabricated with 55 nm technology and with $V_{DD}$=1.2V, and when the sense amplifier 100 is not performing a read operation (EN=0), the only current consumption is due to leakage from technology, and the sense amplifier 100 consumes only about 10 nA in a worst case which occurs at temperatures above 100° C., but the current consumption is typically only 1 nA.

The reduction in current consumption becomes more significant when eight or more sense amplifiers are considered, such as when they are used in a system that has an 8-bit wide or larger data bus. For example, eight of the known sense amplifiers typically consume 160.4 µA when performing a read operation, which is calculated as follows:

8×7500 nA (mirrors)+100000 nA (reference)+8×50 nA (sense amplifiers)=160400 nA

On the other hand, eight sense amplifiers 100 in accordance with the invention typically consume 0.4 µA when performing a read operation, which is calculated as follows:

8×50 nA (sense amplifiers)=400 nA

A ratio 400 nA/160400 nA represents a 99.75% reduction in current consumption by the sense amplifier 100 in accordance with the invention compared to current consumption by the known sense amplifier, when a read operation is being performed. The current consumption by the sense amplifier 100 in accordance with the invention and the current consumption by known sense amplifier are about the same when a read operation is not being performed.

The sense amplifier 100 in accordance with the invention reads the logic level of the bit stored in a bitcell in a manner that is simpler than known methods, and using a circuit that is smaller than a circuit of the known sense amplifier.

Although the invention is described herein with reference to specific embodiments, various modifications and changes can be made without departing from the scope of the present invention as set forth in the claims below. For instance, although the description of one exemplary embodiment of the sense amplifier 100 states that it is disposed on an integrated circuit, the sense amplifier is equally usable when constructed entirely of components consisting of discrete devices.

Although, in one embodiment, the sense amplifier 100 is disposed on an integrated circuit fabricated using CMOS technology, the sense amplifier can also be disposed on an integrated circuit fabricated using other technologies. In one embodiment, the transistors of the sense amplifier 100 are bipolar junction transistors. Although the sense amplifier 100 has been described with respect to specific conductivity types and polarity of potentials, the conductivity types and the polarities of potentials may be reversed.

The specification and figures are to be regarded in an illustrative rather than a restrictive sense, and all such modifications are intended to be included within the scope of the present invention. Any benefits, advantages or solutions to problems described herein with regard to specific embodiments are not intended to be construed as a critical, required or essential feature or element of any or all the claims Unless stated otherwise, terms such as "first" and "second" are used to arbitrarily distinguish between the elements such terms describe. Thus, these terms are not necessarily intended to indicate temporal or other prioritization of such elements. Note that the term "couple" has been used to denote that one or more additional elements may be interposed between two elements that are coupled.

The Detailed Description section, and not the Abstract section, is intended to be used to interpret the claims. The Abstract section may set forth one or more but not all embodiments of the invention, and the Abstract section is not intended to limit the invention or the claims in any way.

Although the invention is described herein with reference to specific embodiments, various modifications and changes can be made without departing from the scope of the present invention as set forth in the claims below.

What is claimed is:

1. A circuit for sensing a logic level of a bit stored in a bitcell, comprising:
   a sense amplifier including an imbalanced latch, the imbalanced latch comprising:
   a first inverter including a first transistor, the first inverter having an input terminal and an OUT_B output node; and
   a second inverter including a second transistor, the second inverter having an input terminal and an OUT output node,
   wherein the OUT_B output node of the first inverter is coupled to the input terminal of the second inverter, and the OUT node of the second inverter is coupled to the input terminal of the first inverter,
   wherein the first transistor has a first channel width (W) to channel length (L) ratio, and the second transistor has a second W/L, and the second W/L of the second transistor is greater than the first W/L of the first transistor,
   wherein the bitcell is operatively coupled to the sense amplifier, and
   wherein at least one of a signal at the OUT_B node and a signal at the OUT node is indicative of a logic level of a bit stored in the bitcell.

2. The circuit of claim 1, wherein the bitcell is operatively coupled to the input terminal of the second inverter of the imbalanced latch.

3. The circuit of claim 1, wherein the first inverter and the second inverter are coupled to provide positive feedback between the first inverter and the second inverter such that the signal at the OUT node and the signal at the OUT_B node have a complementary behavior relative to each other.

4. The circuit of claim 3, wherein a drain terminal of the bitcell is coupled to the input terminal of the second inverter of the imbalanced latch.

5. The circuit of claim 4, wherein the at least one of a signal at the OUT_B node and a signal at the OUT node is indicative of an amount of drain current in the bitcell.

6. The circuit of claim 5, wherein the sense amplifier has a detection threshold $I_{DETECTION}$ such that $$I_{DETECTION} = \frac{(V_{DD} - V_{T124,125})^2}{2} \mu_N C_{OX} \left( \frac{W_{125}L_{124} - W_{124}L_{125}}{L_{124}L_{125}} \right)$$

where $L_{124}$ and $L_{125}$ are channel lengths of the first transistor and the second transistor, respectively, $W_{124}$ and $W_{125}$ are channel widths of the first transistor and the second transistor, respectively, $\mu_N$ is mobility of electrons of the first transistor and the second transistor, $C_{OX}$ is oxide capacitance of the first transistor and the second transistor, and $V_{T124,125}$ is a threshold voltage of the first transistor and the second transistor.

7. The circuit of claim 6, wherein the at least one of a signal at the OUT_B node and a signal at the OUT node is indicative of the amount of drain current in the bitcell relative to $I_{DETECTION}$.

8. The circuit of claim 1, wherein the first transistor and the second transistor have a same W, and wherein L of the second transistor is less than L of the first transistor.

9. The circuit of claim 1, wherein the first transistor and the second transistor have a same L, and wherein W of the second transistor is greater than W of the first transistor.

10. The circuit of claim 1, wherein the W/L of the second transistor is X, and the W/L of the first transistor is less than or equal to 0.9X.

11. The circuit of claim 1, wherein a transconductance of the first transistor is less than a transconductance of the second transistor.

12. The circuit of claim 11, wherein the transconductance of the second transistor is Y, and the transconductance of the first transistor is 0.75Y.

13. A non-volatile memory circuit, comprising:
    a sense amplifier, coupled to a first terminal and to a second terminal of a power supply, the sense amplifier including a first transistor and a second transistor; and
    a non-volatile memory element coupled between the sense amplifier and the second terminal of the power supply,
    wherein the sense amplifier is configured to generate an output signal having one of a first state and a second state, dependent upon an amount of current through the non-volatile memory element relative to a detection threshold $I_{DETECTION}$ as follows, $$I_{DETECTION} = \frac{(V_{DD} - V_{T124,125})^2}{2} \mu_N C_{OX} \left( \frac{W_{125}L_{124} - W_{124}L_{125}}{L_{124}L_{125}} \right)$$

where $L_{124}$ and $L_{125}$ are channel lengths of the first transistor and the second transistor, respectively, $W_{124}$ and $W_{125}$ are channel widths of the first transistor and the second transistor, respectively, $\mu_N$ is mobility of electrons of the first transistor and the second transistor, $C_{OX}$ is oxide capacitance of the first transistor and the second transistor, and $V_{T124,125}$ is a threshold voltage of the first transistor and the second transistor.

14. The non-volatile memory circuit of claim 13, wherein the output signal is indicative of a logic level of a bit stored in the non-volatile memory element.

15. The non-volatile memory circuit of claim 14, wherein the non-volatile memory element is a bitcell of a flash memory.

16. The non-volatile memory circuit of claim 15, wherein a gate terminal of the bitcell is coupled to a voltage, a source terminal of the bitcell is coupled to the second terminal of the power supply, and a drain terminal of the bitcell is coupled to a gate terminal of the second transistor.

17. The non-volatile memory circuit of claim 16, wherein the output signal is indicative of an amount of drain current in the bitcell.

18. A sense amplifier, comprising:
    a first output node and a second output node;
    a first transistor of a first conductivity type having a first conducting electrode coupled to a first terminal of a power supply, a second conducting electrode coupled to the second output node, and a control electrode coupled to the first output node;
    a second transistor of the first conductivity type having a first conducting electrode coupled to the first terminal of the power supply, a second conducting electrode coupled to the first output node, and a control electrode coupled to the second output node;

a third transistor of a second conductivity type having a first conducting electrode coupled to the second output node, a control electrode coupled to the first output node, and a second conducting electrode;

a fourth transistor of the second conductivity type having a first conducting electrode coupled to the first output node, a control electrode coupled to the second output node, and a second conducting electrode, wherein the control electrode of the fourth transistor has a provision for receiving an input signal to be sensed by the sense amplifier;

a fifth transistor of the second conductivity type having a first conducting electrode coupled to a second terminal of the power supply, a control electrode coupled to an enable signal and a first conducting electrode coupled to the second conducting electrode of the third transistor and to the second conducting electrode of the fourth transistor;

a sixth transistor of the first conductivity type having a first conducting electrode coupled to the first terminal of the power supply, a second conducting electrode coupled to the second output node, and a control electrode coupled to the enable signal; and a seventh transistor of the first conductivity type having a first conducting electrode coupled to the first terminal of the power supply, a second conducting electrode coupled to the first output node, and a control electrode coupled to the enable signal, wherein a channel width to channel length ratio of the fourth transistor is greater than a channel width to channel length ratio of the third transistor.

19. The sense amplifier of claim 18, wherein the sense amplifier outputs an output signal including at least one of a voltage at the first output node and a voltage at the second output node, and wherein the output signal is indicative of a level of the input signal.

20. The sense amplifier of claim 18, wherein the first transistor is a PMOS transistor having a source terminal coupled to a first terminal of a power supply, a drain terminal coupled to an OUT_B node, and a gate terminal coupled to an OUT node;

the second transistor is a PMOS transistor having a source terminal coupled to the first terminal of the power supply, a drain terminal coupled to the OUT node, and a gate terminal coupled to the OUT_B node;

the third transistor is a NMOS transistor having a drain terminal coupled to the OUT_B node, a gate terminal coupled to the OUT node, and a source terminal;

the fourth transistor is a NMOS transistor having a drain terminal coupled to the OUT node, a gate terminal coupled to the OUT_B node, and a source terminal;

the fifth transistor is a NMOS transistor having a source terminal coupled to a second terminal of the power supply, a gate terminal coupled to an enable signal and a drain terminal coupled to the source terminal of the third transistor and to the source terminal of the fourth transistor;

the sixth transistor is a PMOS transistor having a source terminal coupled to the first terminal of the power supply, a drain terminal coupled to the OUT_B node, and a gate terminal coupled to the enable signal; and the seventh transistor is a PMOS transistor having a source terminal coupled to the first terminal of the power supply, a drain terminal coupled to the OUT node, and a gate terminal coupled to the enable signal.

* * * * *